United States Patent
Tripsas

[19]

[11] Patent Number: 6,015,717
[45] Date of Patent: Jan. 18, 2000

[54] METHOD FOR MONITORING RAPID THERMAL PROCESS INTEGRITY

[75] Inventor: Nicholas Harris Tripsas, San Jose, Calif.

[73] Assignee: Advanced Micro Devices, Inc., Sunnyvale, Calif.

[21] Appl. No.: 09/042,331

[22] Filed: Mar. 13, 1998

[51] Int. Cl.[7] .............................. G01R 31/26; H01L 21/66
[52] U.S. Cl. ................................................. 438/16; 438/17
[58] Field of Search .................. 438/14, 16, 17

[56] References Cited

U.S. PATENT DOCUMENTS

| | | | |
|---|---|---|---|
| 5,659,467 | 8/1997 | Vickers | 364/138 |
| 5,863,807 | 1/1999 | Jang et al. | 438/14 |

Primary Examiner—Brian Dutton
Attorney, Agent, or Firm—Fliesler, Dubb, Meyer & Lovejoy LLP

[57] ABSTRACT

A method for determining the integrity of a rapid thermal process device which is sensitive to atmospheric leaks. The method includes the steps of providing a wafer having a susceptibility to oxidation-enhanced diffusion into the device. The wafer is then annealed in an inert ambient, and the oxide thickness and sheet resistance of the wafer are then measured. In a further aspect of the invention, a control wafer is simultaneously processed or sequentially processed in the chamber. The control wafer is not sensitive to temperature variation. Following the theories of statistical process control, the analysis of the oxide thickness, sheet resistance and temperature control wafer will allow a determination of whether the ambient leaks have occurred in the system.

18 Claims, 2 Drawing Sheets

METHOD FOR MONITORING RAPID THERMAL PROCESS INTEGRITY

BACKGROUND OF THE INVENTION

1. Field of the Invention

The invention relates to the control of processes used in the manufacture of semiconductor devices, and specifically to control the integrity of thermal processes.

2. Description of the Related Art

In the process sequence of manufacturing of a semiconductor device, annealing or heating steps are applied at various stages in the process to, for example, cure damage to a semiconductor crystal which is induced by implant processes, activate implanted or deposited dopants, or cure deposited films. Traditionally, tube-type furnaces have been utilized for such annealing, but more recently, rapid thermal process technology has been investigated to improve yields and cycle times.

Use of a rapid thermal process (RTP) reduces the thermal budget required for the integrated circuit manufacturing process. For example, RTP technology is a good choice for the growth of thin oxide used in MOS transistors. The trend toward smaller feature sizes on the wafer surface has brought along with it a decrease in the thickness of layers added to the wafer. As devices are scaled to ever-smaller dimensions, the criticality of the RTP processes increases.

Oxides as thin as 100 Å or less are very difficult to control in tube furnaces due to the problem of quickly supplying and removing oxygen from the system.

However, rapid thermal processing tools are seeing an increase in their use in forming such thin oxides. RTP processing tools also have applications in silicide formation, implant annealing, shallow junction formation, thermal oxidation, and chemical vapor deposition (CVD) processes.

In all of these processes, control of the ambient gases in the rapid thermal processing tool is critical to the control and repeatability of the process. For example, certain types of implanted silicon crystals such as, for example, boron and phosphorous, are subject to an effect known as oxidation enhanced diffusion (OED). In essence, oxidation in a silicon wafer doped with one of the aforementioned impurities is enhanced in the thermal environment, and control of ambient oxygen in the annealing process is critical to ensuring that such oxidation does not destroy the device being processed.

SUMMARY OF THE INVENTION

The invention comprises a method for determining the integrity of a rapid thermal process device which is sensitive to atmospheric leaks. In one aspect, the invention comprises providing a wafer having a susceptibility to oxidation-enhanced diffusion into the device. The wafer is then annealed in an inert ambient, and the oxide thickness and sheet resistance of the wafer are then measured. In a further aspect of the invention, a control wafer is simultaneously processed or sequentially processed in the chamber. The control wafer is sensitive to temperature variation.

Following the theories of statistical process control, the analysis of the oxide thickness, sheet resistance and temperature control wafer will allow a determination of whether the ambient leaks have occurred in the system.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION OF THE PREFERRED EMBODIMENTS

The method of the present invention takes advantage of the oxidation-enhanced diffusion (OED) effect to monitor the amount of ambient gases which may be present in a rapid thermal process chamber. During oxidation, silicon interstitials are injected into the silicon substrate and diffused away from the surface to the bulk. Dopant atoms which prefer pairing with an interstitial as a diffusant mechanism diffuse faster in oxidizing ambient. Oxidation generates excess silicon self interstitials, tending to enhance the diffusivities of those atoms which diffuse with a significant interstitial component (for instance, boron and phosphorous) and tend to retard the diffusivities of atoms which diffuse predominantly via a vacancy mechanism (like antimony).

In accordance with the method of the invention, in a first aspect, a clean unprocessed silicon wafer having a first conductivity dopant is utilized. The wafer is implanted with a dopant, such as boron, arsenic, phosphorous or indium, which is subject to OED. (It should be recognized that alternative methods of imparting the dopant into the substrate may be utilized.)

Figure 1:
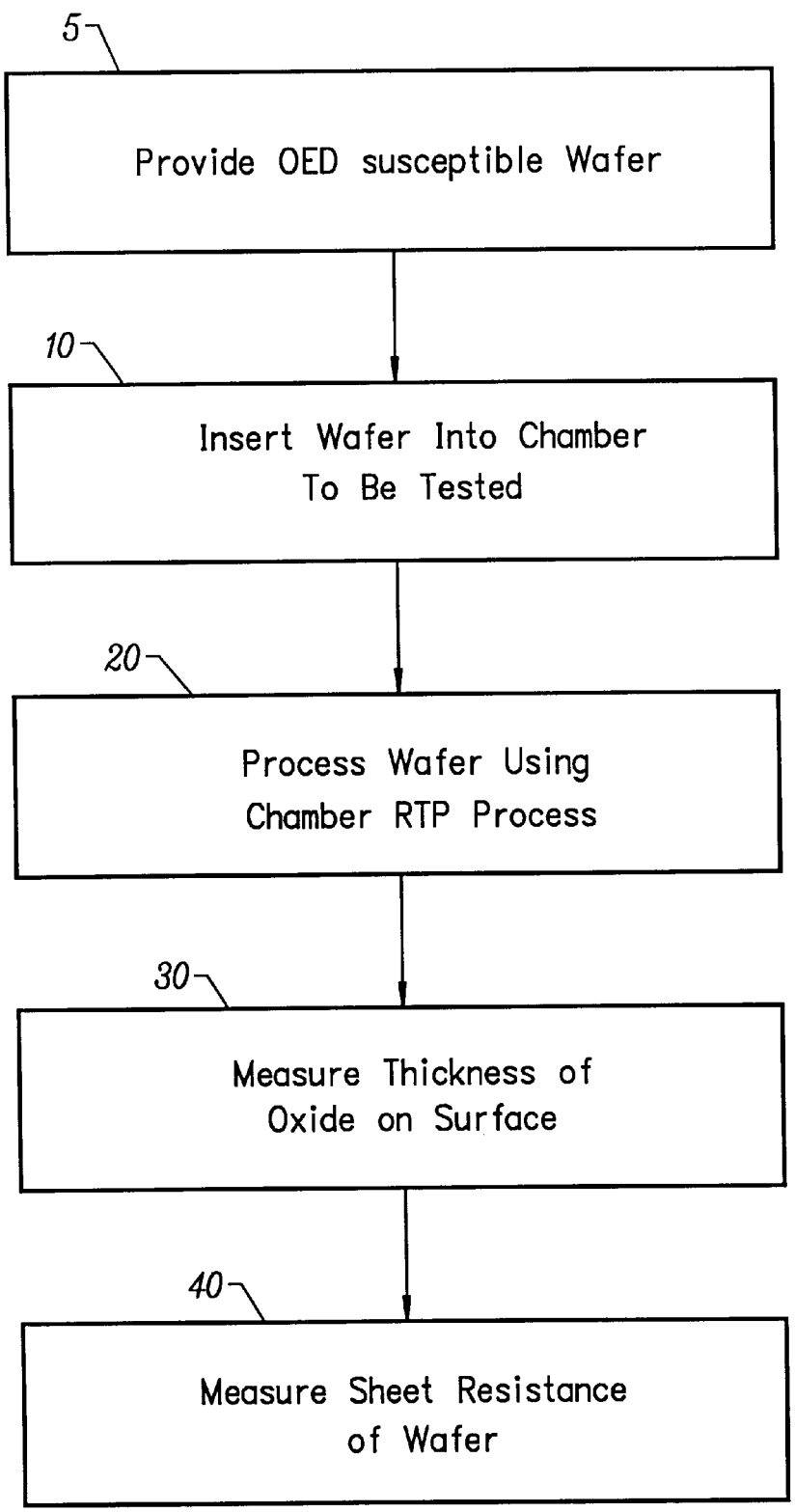
FIG. 1 is a flow chart of a first aspect of the method in accordance with the present invention.

The wafer is then inserted in the process chamber which is to be monitored, as shown in step 10 in FIG. 1. The chamber will then be evacuated of room gases to a point where the chamber should be free of ambient gases. The chamber may be optionally filled with an inert ambient and/or be at vacuum.

A rapid thermal process will then be conducted on the wafer using the inert ambient, as shown at step 20 in FIG. 1. The particular process is dependent upon the chamber being tested and is not critical to the invention. Indeed, the method of the invention is intended to be independent of the RTP process, for cross-platform use.

Next, the oxide thickness on the wafer will be measured. The existence of a thick oxide layer will reveal the presence of a gross leak in the chamber. This is shown at step 30 in FIG. 1.

Subsequently, in accordance with the method of the invention at step 40, the sheet resistance of the wafer will be measured. Even if a gross air leak is not present, small air leaks into the chamber will introduce enough oxygen to result in oxidation enhanced diffusion which will lower the sheet resistance of the wafer. Less oxygen will result in less OED and a measurably higher sheet resistance.

Optionally, in a further aspect of the invention, a second wafer may be processed as a temperature control in the test chamber. This temperature control wafer may comprise a silicon substrate which, for example, has not been implanted with an impurity which is subject to OED. The wafer would, however, be sensitive to temperature, by, for example, monitoring sheet resistance as a function of temperature variation. For example, annealing a wafer highly doped (e.g. $1_e16$ atm/cm$^2$) with arsenic allows measurement in the change of sheet resistance of the control wafer, where the change in sheet resistance of such wafer is subject to change with temperature.

Figure 2:
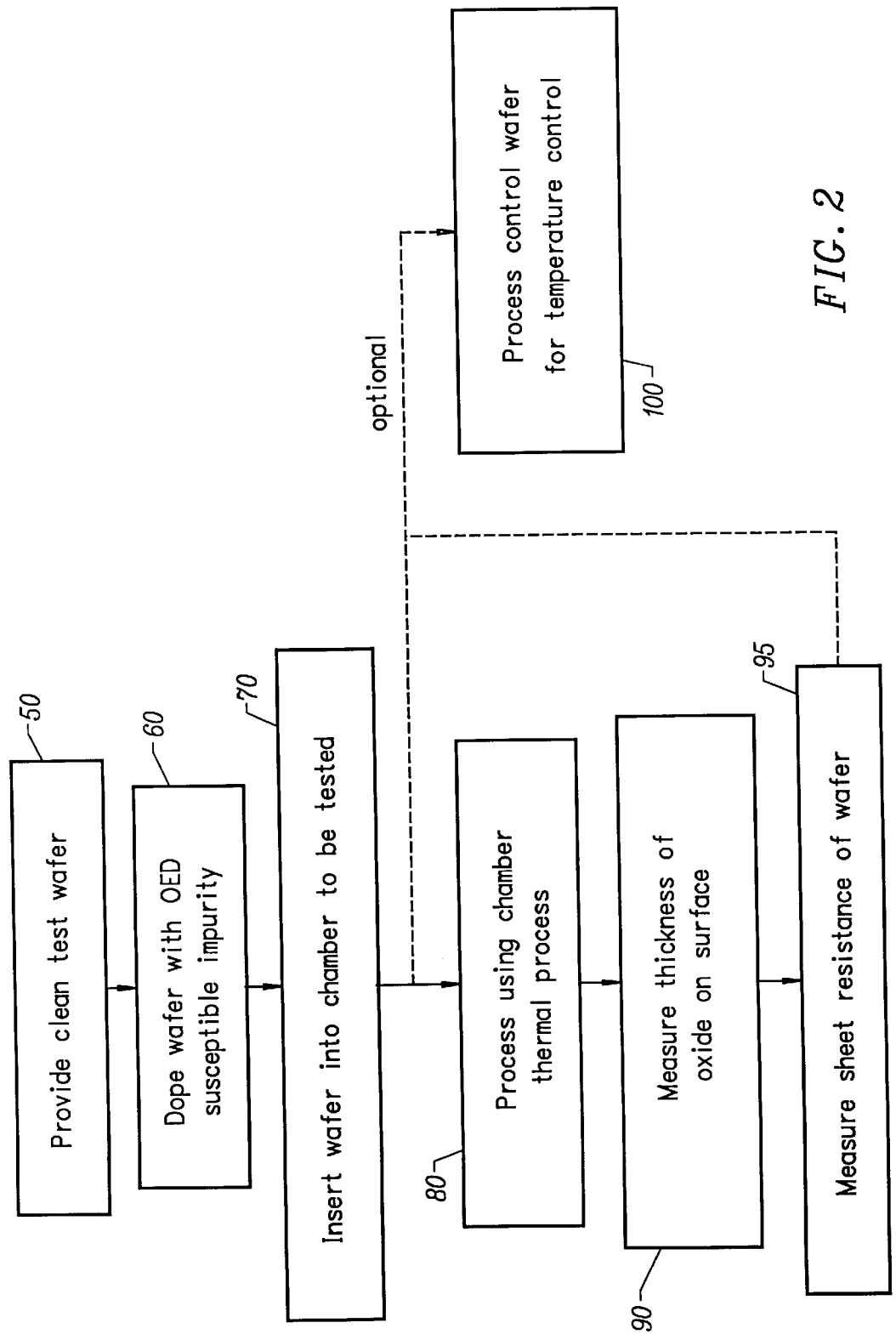
FIG. 2 is a flow chart of the second embodiment of the present invention.

A specific example of the process of the present invention is illustrated with respect to FIG. 2. In FIG. 2, a clean, unprocessed N-type test wafer which is lightly doped with 5 to 50 ohm/cm of an N-type impurity is utilized at the beginning of the process at step 50.

At step 60 in FIG. 2, the test wafer is doped, as for example by implanting with a high concentration, shallow dose, of an impurity such as boron using, for example, B+ or $BF_2$+. It should be recognized that any boron-containing molecule is acceptable for purposes of the invention, and boron need not be the impurity utilized.

An implant at an energy of approximately 200 eV to 20 KeV, and a dose in a range from $1 \times 10^{14} – 5 \times 10^{15}$ atm/cm$^2$ is suitable.

Subsequently, at step 70, the wafer is inserted into the chamber.

As shown at step 80, the test wafer is then processed in the rapid thermal process chamber which is to be monitored by the method of the present invention. Annealing takes place in an inert ambient. The exact conditions utilized for the test will depend on the process chamber which is to be monitored. In a typical case, the ambient might consist of nitrogen or argon, the temperature range of the annealed process would be between approximately 800° C. and 1,100° C., and the process time for the anneal would be approximately 5–100 seconds.

At step 90, the oxide thickness of the wafer is measured following the annealing process. Typically, if no air leaks are present, very little or no oxide should be present on the wafer. A thicker oxide than that typically grown in such an environment would indicate an air leak of, for example, greater than 1% oxygen.

Following the oxide thickness measurement, the sheet resistance of the wafer is measured. This step 95 may be conducted, for example, with a four-point resistance probe of a type conventionally utilized in the art. Low levels of oxygen from air leaks (generally 5 to 50 parts per thousand (PPT) $O_2$) can result in increased oxide enhanced diffusion but little measurable oxide. This will reduce sheet resistance by increasing the junction depth of the implanted layer.

As shown at step 100, either simultaneously with the process steps 80,90,95 or following step 95, a temperature control wafer, which is not susceptible to OED, will be processed. Many methods are acceptable for processing such a control wafer, including rapid thermal oxidation (RTO), annealing a high dose of arsenic (in an n-type wafer), and thermocouple wafers.

Subsequently, statistical process control theories can be applied to the measured qualities to continuously monitor air leaks in the chamber. By monitoring the aforementioned measurements and applying the principles of statistical process control, an RTP chamber can be monitored for room air leaks. In one aspect of the present invention, measurement of the oxide thickness and heat resistance monitor ensure that gross air leaks and small air leaks will not be present in the processing chamber. In a further aspect of the invention, the temperature control process wafer is utilized to monitor for temperature variations in the system. Since the temperature control process wafer is not subject to OED, oxidation in the wafer will not occur subject to the thermal process. However, the wafer which is utilized will be temperature sensitive, to ensure that the temperature in the process chamber is at a sufficient level to subject the temperature control wafer to known variances for sheet resistance and, for example, an arsenic-diffused wafer. Measurement of the sheet resistance on the arsenic controlled wafer will ensure that temperature variations have not occurred.

The many features and aspects of the method of the present invention will be readily apparent to one of average skill in the art. Numerous variations in the process of the present invention may be incorporated without varying from the scope of the invention as defined by the attached claims. All such features and aspects are intended to be included with the invention as defined herein.

What is claimed is:

1. A method of monitoring a rapid thermal process wherein said process in sensitive to leaks, comprising:
    (a) providing a test wafer having a first conductivity type;
    (b) doping the wafer with a dopant of an opposite conductivity type;
    (c) annealing the wafer in an inert ambient;
    (d) measuring the oxide thickness of the wafer; and
    (e) measuring the sheet resistance of the wafer.

2. The method of claim 1 wherein said step (b) comprises implanting a dopant having a susceptibility to oxidation enhanced diffusion.

3. The method of claim 2 wherein said step (b) comprises implanting a dopant consisting of boron, arsenic or phosphorous.

4. The method of claim 1 wherein the substrate is an n-type wafer.

5. The method of claim 2 wherein said step (b) comprises implanting boron at an energy level of approximately 200 eV to 20 KeV to provide a dose in the range of $1 \times 10^{14} – 5 \times 10^{15}$ atm/cm.$^2$.

6. The method of claim 1 wherein said step (c) comprises heating the wafer at a temperature of approximately 800° C. to 1,100° C. for a period of approximately 5–100 seconds.

7. The method of claim 1 wherein said step (e) comprises utilizing a four-point probe measurement of the sheet resistance of the wafer.

8. The method of claim 1 further including the step of simultaneously processing a temperature control wafer.

9. The method of claim 8 wherein said processing step comprises annealing the control wafer in an inert ambient for a period and at a temperature equivalent to the test wafer.

10. The method of claim 8 further including the step of measuring the sheet resistance of the control wafer.

11. The method of claim 1 further including the step, following step (e), of processing a temperature control wafer.

12. The method of claim 11 wherein said processing step comprises annealing the control wafer in an inert ambient for a period and at a temperature equivalent to the test wafer.

13. The method of claim 11 further including the step of measuring the sheet resistance of the control wafer.

14. A method of monitoring leakage in a sealed process chamber, comprising:
    (a) annealing a test wafer having a susceptibility to oxide enhanced diffusion for a period and at a temperature;
    (b) measuring the oxide thickness of the test wafer;
    (c) measuring the sheet resistance of the test wafer; and
    (d) processing a control wafer, the control wafer being unsusceptible to oxide enhanced diffusion.

15. The method of claim 14 wherein said step (d) comprises:
    subsequent to step (c), annealing the control wafer for the period and at the temperature; and
    measuring the sheet resistance of the control wafer.

16. The method of claim 14 wherein said step (a) comprises annealing an n-type wafer having a dopant of boron, arsenic or phosphorous provided therein.

17. The method of claim 14 wherein said step (a) comprises annealing a wafer having implanted therein boron in a range of approximately $1\times10^{14}$–$5\times10^{15}$ atm/cm.$^2$.

18. The method of claim 14 wherein said step (d) comprises:

(1) simultaneously annealing the control wafer with the test wafer at a period and a temperature equivalent to the test wafer; and (2) measuring the sheet resistance of the control wafer.

* * * * *